United States Patent
Eggert et al.

(10) Patent No.: US 7,151,298 B1
(45) Date of Patent: Dec. 19, 2006

(54) ELECTROSTATIC DISCHARGE PROTECTION NETWORK HAVING DISTRIBUTED COMPONENTS

(75) Inventors: Dietmar Eggert, Dresden (DE); Wolfram Kluge, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/468,015

(22) Filed: Dec. 20, 1999

(51) Int. Cl.
H01L 23/62 (2006.01)
H02H 9/00 (2006.01)
H01F 5/00 (2006.01)

(52) U.S. Cl. ............. 257/355; 257/356; 257/357; 257/360; 336/200; 361/54; 361/56; 361/111

(58) Field of Classification Search ............ 361/54, 361/56, 111; 257/355–357, 360; 336/200
See application file for complete search history.

(56) References Cited

U.S. PATENT DOCUMENTS

| | | | |
|---|---|---|---|
| 5,227,659 A | 7/1993 | Hubbard | 257/531 |
| 5,431,987 A * | 7/1995 | Ikeda | 257/531 |
| 5,529,831 A * | 6/1996 | Waga et al. | 428/209 |
| 5,546,038 A | 8/1996 | Croft | 327/310 |
| 5,576,680 A * | 11/1996 | Ling | 336/200 |
| 5,578,860 A * | 11/1996 | Costa et al. | 257/528 |
| 5,831,331 A | 11/1998 | Lee | 257/659 |
| 5,901,022 A * | 5/1999 | Ker | 361/56 |
| 5,939,753 A | 8/1999 | Ma et al. | 257/339 |
| 5,969,929 A * | 10/1999 | Kleveland et al. | 361/111 |
| 6,034,400 A * | 3/2000 | Waggoner et al. | 257/355 |
| 6,058,000 A * | 5/2000 | Koenck et al. | 361/113 |
| 6,101,371 A * | 8/2000 | Barber et al. | 455/73 |

FOREIGN PATENT DOCUMENTS

JP 11067486 9/1999

OTHER PUBLICATIONS

Stan Gibilisco, "The Illustrated Dictionary of Electronics", 1997, McGraw-Hill, Seventh Edition, p. 413.*

* cited by examiner

*Primary Examiner*—Tanh Q Nguyen
(74) *Attorney, Agent, or Firm*—Williams, Morgan & Amerson, P.C.

(57) ABSTRACT

An electrostatic discharge protection network comprising electrostatic discharge (ESD) clamp devices distributed between turns of a coil shaped inductor. The inductance of the coil shaped inductor and parasitic capacitance of the ESD clamp devices form a low pass filter structure having a very high cut-off frequency. Below the low pass filter cutoff frequency, the capacitive influence of the ESD clamp devices are cancelled by the series inductance of the coil shaped inductor. The turns of the coil shaped inductor may be fabricated on insulation layers proximate to one another so as to achieve close magnetic coupling there between, thereby achieving a larger inductance value for a given sized coil structure. Improved input and output impedance matching is also achieved by adjusting the inductive and capacitive components of the low pass filter structure formed by the coil shaped inductor and capacitance of the ESD clamp devices.

24 Claims, 6 Drawing Sheets

ELECTROSTATIC DISCHARGE PROTECTION NETWORK HAVING DISTRIBUTED COMPONENTS

BACKGROUND OF THE INVENTION

1. Field of the Invention

The present invention relates to electronic circuits and systems sensitive to electrostatic discharge, and more particularly, to a distributed electrostatic discharge protection network for these electronic circuits and systems operating at radio frequencies.

2. Description of the Related Technology

Electrostatic charge was discovered by the early Greeks and was a novelty until electricity became better understood and more widely used. An electrostatic charge potential may become so large that the insulation medium between the positive and negative charges breaks down. This break down results in what is called "electrostatic discharge" or "ESD." Examples of minor and major ESD events are an electric spark from a metal door knob to one's finger after shuffling across a carpeted floor, and a lightning bolt between the earth and the clouds, respectively. Electrical and electronic devices and systems are sensitive to ESD because insulation breakdowns, caused by ESD, may seriously degrade the electrical performance characteristics of the device or system. Electrical power systems are protected from ESD (lightning) by protective devices having voltage break down characteristics that short out and dissipate the ESD event before it can damage the electrical system.

Electronic circuits and systems have become more susceptible to ESD damage as the circuit elements thereof have become smaller and the insulation thinner therebetween. During the era of vacuum tube technology, the vacuum tube's operating voltages were hundreds or even thousands of volts, and the spacing between the vacuum tube's elements were fractions of an inch. Today, devices (transistors and diodes) in very large scale integrated circuits typically operate at three to five volts and have element and insulation dimensions of thousandths of an inch (microns). With the micron element spacing of integrated circuit devices, even relatively small ESD events can be catastrophic. The electronics industry has addressed the ESD problem in various ways. One way is to add ESD protective devices into an electronic system so that ail input and output lines are clamped below an ESD voltage that would damage the integrated circuits. Using an added ESD protective device, however, does not prevent integrated circuit ESD damage before the protective device is connected to the integrated circuit. Integrated circuit manufacturers have thus tried to incorporate some form of ESD protection into the integrated circuits themselves. Various forms of ESD protective devices such as zener diodes, capacitors and other controlled break down or surge filtering devices have been used to protect integrated circuit input/output ("I/O") lines and typically may be connected between the I/O lines and both power supply rails ($V_{DD}$ and ground). These ESD protective devices, however, have a significant amount of parasitic capacitance (capacitance associated with the structure of the ESD device). This parasitic capacitance may degrade the high frequency signal performance of the I/O lines of the digital integrated circuit that are connected to the ESD protective devices. In addition, the ESD protective devices generally require series resistors, for example, of about 300 ohms in series with each signal path. This combination of significant parasitic capacitance and relatively high series resistance in each of the signal paths of the I/O lines may prevent or impair proper performance of high frequency signals, especially digital signals having very fast rising and falling transition levels, i.e., logic 0 to logic 1, and logic 1 to logic 0, respectively.

What is needed is a system, method and apparatus for electrostatic discharge protection which does not significantly degrade high frequency signal performance.

SUMMARY OF THE INVENTION

The present invention overcomes the above-identified problems as well as other shortcomings and deficiencies of existing technologies by providing a system, method and apparatus for electrostatic discharge protection which does not significantly degrade high frequency signal performance. The embodiments of the present invention provide an electrostatic discharge protection network comprising an inductor having at least one turn of a coil, and at least one ESD clamp device connected to the at least one turn of the coil. More than one coil turn may be associated with one ESD clamp device, and more than one ESD clamp device may be associated with one turn of the coil. It is contemplated and within the scope of the present invention that the inductor coil may be comprised of any shape or form, and the ESD clamp device may be, for example but not limitation, a semiconductor device, a gas discharge device, a zener device, metal oxide varistor, avalanche or tunnel diode, or any other type of voltage limiting device.

The inductor portion of the embodiments of the present invention is connected in series between an electronic circuit node being protected and an external signal node which is subject to an ESD event. The ESD clamp device(s) may be connected to the inductor, preferably at each turn of the inductor coil, and to one or both of the common power supply rails. One of the common power supply rails may be at earth ground potential. In addition, it is contemplated and within the scope of the present invention that some of the ESD clamp devices may also be connected between one or more turns of the inductor coil and earth ground.

In the embodiments of the present invention, the series connected inductor coil and parallel or shunt connected ESD clamp devices, having parasitic capacitance associated therewith, form cascaded "π" sections of a low pass filter network. The series inductance of the inductor coil preferably cancels out the shunt capacitance of the ESD clamp device(s) connected thereto for signal frequencies below the low pass filter cutoff frequency. Efficient impedance matching for low impedance signal nodes may be accomplished by appropriate selection of inductance and capacitance values for the ESD network of the present invention.

According to an embodiment of the present invention, the ESD protection network is fabricated on a semiconductor integrated circuit substrate, a plurality of turns of a coil are formed from a plurality of conductive layers with a plurality of insulation layers interleaved therebetween. Each one of the plurality of insulation layers having a one of the plurality of conductive layers (forming each coil turn) thereon. Vias are formed in each of the plurality of insulation layers, and conductive material is deposited therein for connecting the plurality of coil turns together to form the inductor. The ESD clamp devices may be formed on each of the insulation layers and attached to the conductive layer coil turns on the insulation layers, or the ESD clamp devices may be formed in the semiconductor substrate as P and N junction wells with connection to the plurality of coil turns made through conductive vias in the various insulation layers on which the conductive layer coil turns are formed thereon.

According to another embodiment of the invention, the ESD protection network is fabricated on a substrate made of insulation material such as ceramic, glass epoxy, a printed wiring board (PWB) and the like. A plurality of turns of a coil are formed on a plurality of insulation layers on the substrate. Each one of the plurality of insulation layers having a one of the plurality of the coil turns thereon. Vias are formed in each of the plurality of insulation layers, and conductive material is deposited therein for connecting the plurality of coil turns together to form the inductor. The ESD clamp devices may be formed or attached oil each of the insulation layers or the ESD clamp devices may be attached to the substrate with connection to the plurality of coil turns made through conductive vias in the various conductive layers the coil turns are formed therefrom.

According to still another embodiment of the present invention, the ESD protection network is fabricated on an non-conductive (insulation) printed circuit board using printed circuit stripline conductors and surface mounted components. The insulation portion of the printed circuit board may be, for example but not limitation, glass epoxy, TEFLON® (a registered trademark of Dupont Co.), ceramic, glass and the like. The printed circuit stripline enables a constant impedance for the signal path. A plurality of turns of a coil are formed on the printed circuit board in a concentric spiral configuration. A metalized via (plated through hole) is formed through the printed circuit board at each of the plurality of coil turns, or portions thereof, and an ESD clamp device is attached to each of these vias and a planar ground plane located on the face opposite the face on which the plurality of coil turns is located thereon. The ESD clamp devices may be connected to the vias and the planar ground plane preferably using surface mount techniques. The plurality of coil turns may be tapped with vias at points of the coil representing a desired inductance needed to cancel out the parasitic capacitance of the associated ESD clamp device. The outer or larger coil turn(s) may be tapped at less than 360 degrees, and the inner or smaller coil turns may be tapped at more than 360 degrees, i.e., a multiple turn.

According to the aforementioned embodiments of the present invention, the insulation layers between the coil turns of the inductor may preferably be very thin so that the turns of the coil are close together, thus, improving the magnetic coupling therebetween and increasing the effective inductance for a given size coil diameter. It is also contemplated and within the scope of the present invention that a material of high magnetic permeability may be used by locating same within the coil so as to further increase the effective inductance value for a give size of coil structure. This material may be, for example but not limitation, iron oxide, ferrite, or other materials that increase the effective inductance of the inductor coil.

An advantage of the present invention is that signal paths may be protected from an ESD event without causing significant attenuation or degradation of desired high frequency signals.

Another advantage is that parasitic capacitance of an ESD clamp device may be effectively canceled by a series connected inductance.

Still another advantage is attenuation of ESD frequencies above a desired low-pass filter cut-off frequency.

A feature of the present invention is fabricating a coil inductor on a semiconductor integrated circuit die by depositing each turn of the coil on a respective insulation layer and connecting the turns together with metalized vias through these respective insulation layers.

Another feature is using vias to connect an ESD clamp device to each turn of the inductor coil.

Still another feature is having a constant impedance signal path that protects against an ESD event without significant attenuation of desired signal frequencies.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENT

Figure 1:
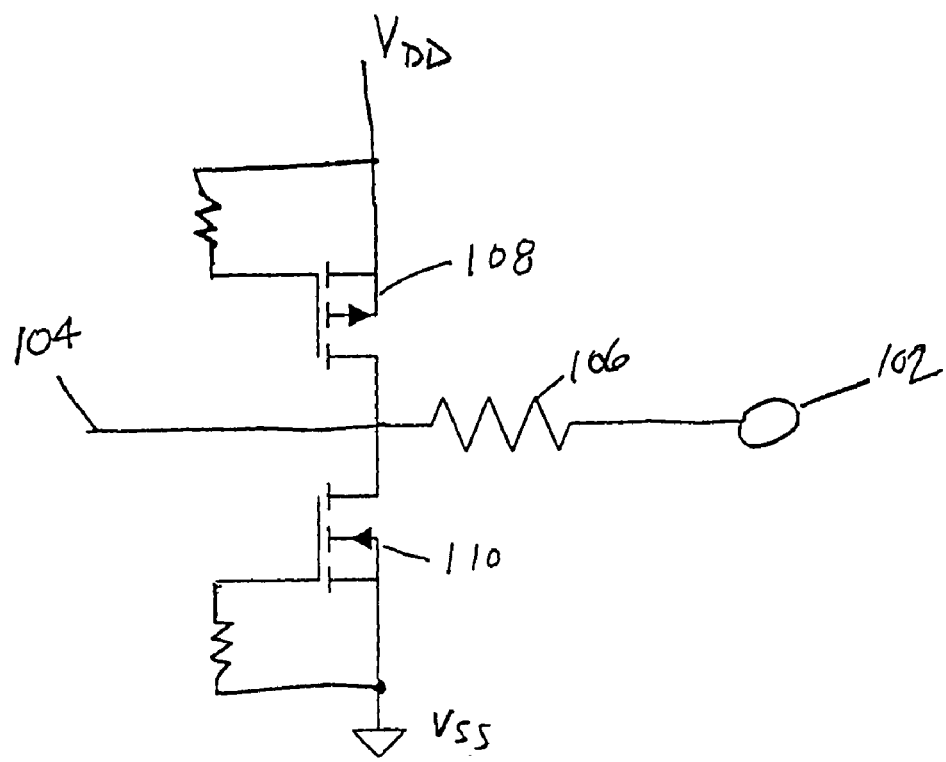
FIG. 1 is a schematic diagram of a prior art ESD protective circuit.

Referring to FIG. 1, a schematic diagram of a prior art ESD protective circuit for an integrated circuit is illustrated. An external signal node 104 is adapted for connection to signal circuits external to the integrated circuit package (not illustrated). The external signal node 104 may be for input and/or output signals. An internal signal node 102 is adapted for connection to signal circuits internal to the integrated circuit package. A resistor 106 is connected in series between signal nodes 102 and 104. The resistor 106 may be, for example, 300 ohms. The signal node 104 and the resistor 106 may be connected to ESD clamp devices 108 and 110. The ESD clamp devices 108 and 110 may also be connected the an electronic system's power rails $V_{DD}$ and $V_{SS}$, respectively. The ESD clamp devices 108 and 110 limit transient voltages coming into signal node 102 to approximately the voltages of the power rails $V_{DD}$ and $V_{SS}$. A P-channel metal oxide semiconductor (PMOS) transistor and an N-channel metal oxide semiconductor (NMOS) transistor are illustrated for the ESD clamp devices 108 and 110, respectively.

The ESD protection circuit illustrated in FIG. 1 is effective but degrades the high frequency performance of desired signals because the ESD clamp devices 108 and 110 have inherent parasitic capacitance and when connected to the resistor 106 form a RC low pass filter that may cause significant attenuation of fast rising digital signals. In addition, impedance matching for optimum signal to noise ratio and/or power transfer is greatly affected when the external signal circuit impedance is much lower than the value of the resistor 106, e.g., 50 ohms. The embodiments of the present invention eliminate the requirement for the series connected resistor 106 and effectively cancel out the undesirable parasitic capacitance at the desired signal frequencies.

The present invention is a system, method and apparatus for providing an electrostatic discharge protection network on an integrated circuit die, a monolithic substrate, and a printed circuit board with or without constant impedance stripline conductors. Embodiments of the invention comprise an inductor having at least one turn of a coil, and at least one ESD clamp device connected to the at least one turn of the coil. More than one coil turn may be associated with one ESD clamp device, and more than one ESD clamp device may be associated with one turn of the coil. It is contemplated and within the scope of the present invention that the inductor coil may be comprised of any shape or form, and the ESD clamp device may be, for example but not limitation, a semiconductor device, a gas discharge device, a zener device, metal oxide varistor, avalanche or tunnel diode, or any other type of transient voltage limiting device.

The inductor portion of the embodiments of the present invention is connected in series between an electronic circuit node being protected and an external signal node which is subject to an ESD event. The ESD clamp device(s) may be connected to the inductor, preferably at each turn of the inductor coil, and to one or both of the common power supply rails. One of the common power supply rails may be at earth ground potential. In addition, it is contemplated and within the scope of the present invention that some of the ESD clamp devices may also be connected between one or more turns of the inductor coil and earth ground.

Referring now to the drawings, the details of preferred embodiments of the present invention are schematically illustrated. Like elements in the drawings will be represented by like numbers, and similar elements will be represented by like numbers with a different lower case letter suffix.

Figure 2:
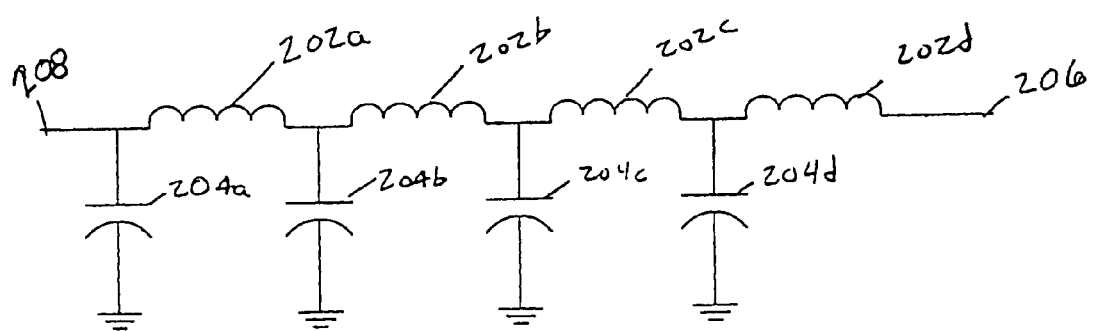
FIG. 2 is a schematic diagram of an ESD protection circuit, according to the present invention.
Figure 2:
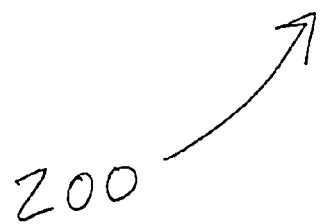

Referring to FIG. 2, a schematic diagram of the ESD protection circuit of the embodiments of the invention is illustrated. The ESD protection circuit of the present invention is generally represented by the numeral 200 and has an external node 206 and an internal node 208. The external node 206 is adapted for connection to circuits having desired signals with undesirable ESD events and the internal node 208 is adapted for connection to circuits needing protection from ESD events. Between the nodes 206 and 208, the ESD protection circuit 200 comprises a series connected inductor 202 between the nodes 206 and 208, wherein the inductor 202 has tapped portions 202a, 202b, 202c and 202d. Parallel or shunt connected ESD clamp devices represented by their parasitic capacitance 204a, 204b, 202c and 204d are connected to respective inductor 202 tapped portions 202a, 202b, 202c and 202d. The inductor 202 and ESD clamp parasitic capacitance 204 form cascaded "π" sections of a low pass filter network. The series inductance of the inductor coil 202 portions 202a, 202b, 202c and 202d preferably cancel out the shunt parasitic capacitance 204a, 204b, 202c and 204d of the ESD clamp device(s) connected thereto for signal frequencies below the low pass filter cutoff frequency. Appropriate selection of inductance 202 and capacitance 204 values for the ESD network 200 may also be used for efficient impedance matching of the signal nodes 206 and 208 to a source and load, respectively.

Figure 3:
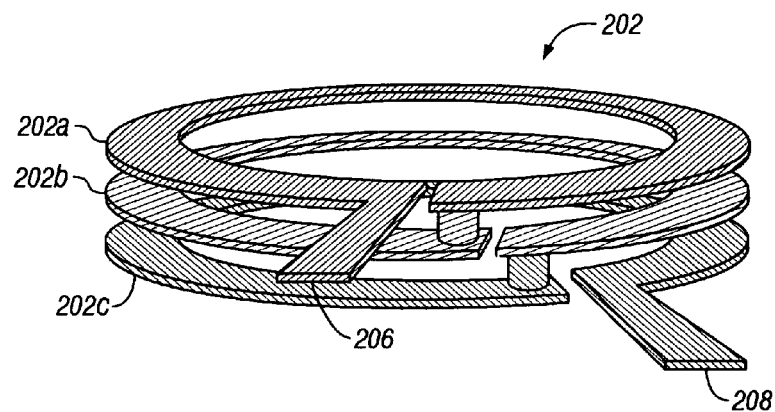
FIG. 3 is a schematic orthogonal view of a coil portion of the invention.

Referring now to FIG. 3, a schematic orthogonal view of an embodiment of the invention is illustrated. The ESD protection network 200 may be fabricated on a semiconductor integrated circuit substrate or any other type of substrate which has insulation thereon (not illustrated). The inductor 202 may be comprised of a plurality of turns formed from conductive layers that are coil shaped. These coil shaped conductive layers, illustrated in FIG. 3 as coil turns 202a, 202b and 202c, are formed on a plurality of insulation layers (not illustrated for clarity). Each coil shaped conductive layer is formed on a respective insulation layer (See FIG. 4). Vias through the insulation layers are used to connect the different coil shaped conductive layers together by conductive connections therethrough (See FIG. 4). The shape of the coil may be for example but not limitation, round, square, rectangle, triangle, oval, hexagon, octagon and the like. The conductive layer may be comprised of metal such as, for example but not limitation, copper, aluminum, copper alloy and aluminum alloy, or any other conductive material used in the fabrication of an integrated circuit, such as conductive doped polysilicon.

Figure 4:
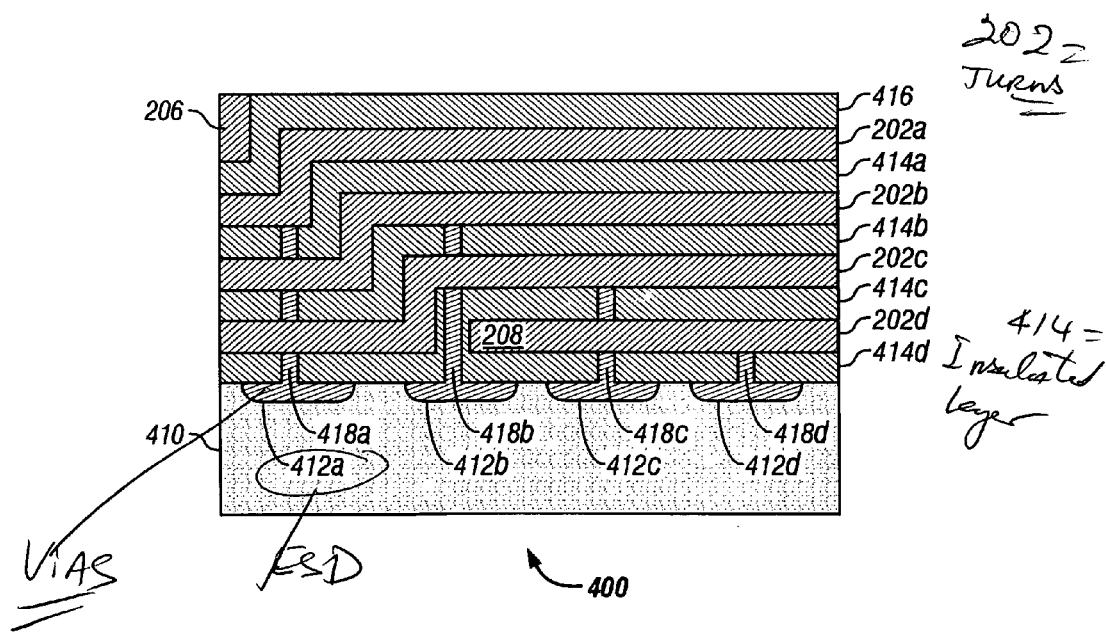
FIG. 4 is a schematic elevational cross-section view of an ESD network fabricated on a semiconductor integrated circuit die.

Referring now to FIG. 4, a schematic elevational cross-section view of the ESD network 200 fabricated on a semiconductor integrated circuit die is illustrated. An integrated circuit die, generally represented by the numeral 400, comprises a substrate 410 having doped wells 412a, 412b, 412c and 412d in which ESD clamp devices have either or both PMOS and NMOS transistors formed therein. The PMOS and NMOS transistors of the ESD clamp devices may be connected to the power supply rails, $V_{DD}$ and $V_{SS}$, in a fashion similar to the PMOS and NMOS transistor connections illustrated in FIG. 1.

Insulation layer 414d is formed over the substrate 410 and wells 412a, 412b, 412c and 412d. The insulation layer 414d may also be formed over other conducting and insulation layers proximate to the substrate 410. The coil turn 202d is formed over the insulation layer 414d. Similarly, insulation layers 414c, 414b and 414a, and coil turns 202c, 202b and 202a are formed as illustrated in FIG. 4. Another insulation layer 416 may be formed over the coil turn 202a for additional circuitry or physical protection of the integrated circuit die.

The ESD clamp devices formed in the wells 412a, 412b, 412c and 412d may be connected to the coil turns 202a, 202b, 202c and 202d, respectively, through conductive vias (holes) in the insulation layers 414a, 414b, 414c and 414d. The vias are filled with a conductive material such as aluminum. As illustrated in FIG. 4, Vias 418a pass through insulation layers 414d, 414c and 414b, and connect the ESD clamp device in the well 412a to the coil turn 202a. The vias 418a do not connect to the other coil turns 202b, 202c and 202d. Vias 418b pass through insulation layers 414d, 414c and 414b, and connect the ESD clamp device in the well 412b to the coil turn 202b. The vias 418b do not connect to the other coil turns 202a, 202c and 202d. Vias 418c pass through insulation layers 414d and 414c, and connect the ESD clamp device in the well 412c to the coil turn 202c. The vias 418c do not connect to the other coil turns 202a, 202b and 202d. Via 418d passes through insulation layer 414d, and connects the ESD clamp device in the well 412d to the coil turn 202d. The internal node 208 connects to circuit logic (not illustrated) of the integrated circuit die, and the external node 206 is adapted for connection to external circuitry. It is also contemplated and within the scope of the invention that the ESD clamp devices may be formed on or attached to each of the insulation layers.

According to another embodiment of the invention, the ESD protection network may be fabricated on a substrate made of either insulation material such as ceramic, glass epoxy, a printed wiring board (PWB) and the like, or conductive material such as aluminum, copper, steel brass and the like. A plurality of turns of a coil are formed on a plurality of insulation layers on the substrate. Each one of the plurality of insulation layers having a one of the plurality of the coil turns thereon. Vias are formed in each of the plurality of insulation layers, and conductive material is deposited therein for connecting the plurality of coil turns together to form the inductor. The ESD clamp devices may be formed or attached on each of the insulation layers or the ESD clamp devices may be attached to the substrate with connection to the plurality of coil turns made through conductive vias in the various insulation layers on which the coil turns are formed thereon.

Figure 5:
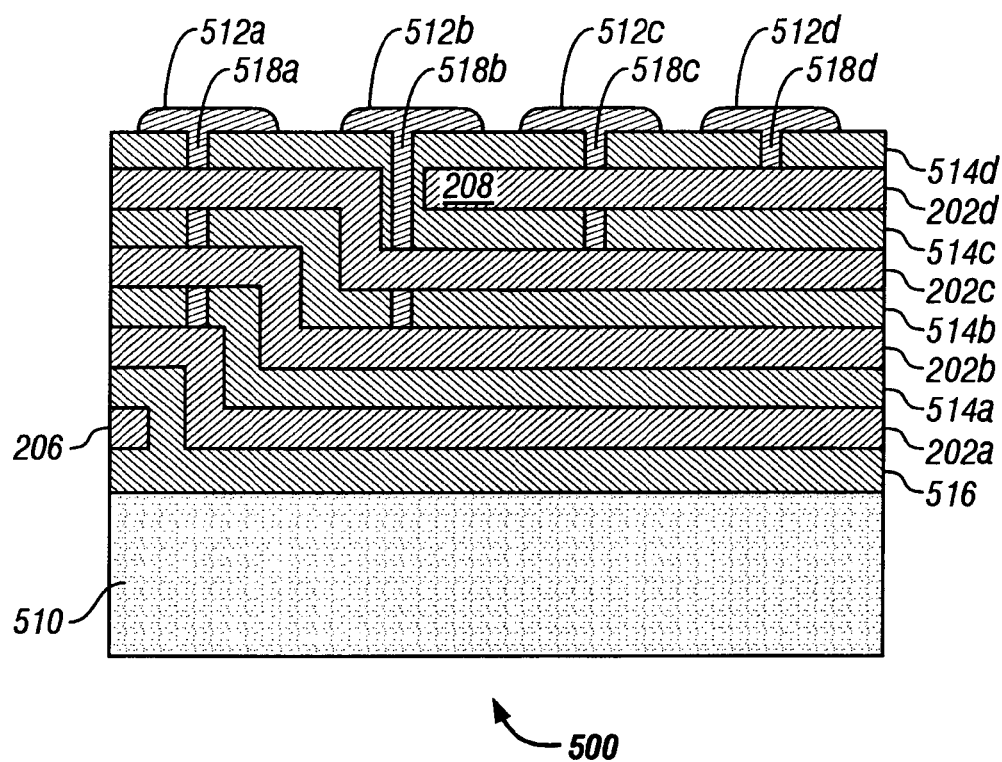
FIG. 5 is a schematic elevational cross-section view of an ESD network fabricated on a substrate.

Referring now to FIG. 5, a schematic elevational cross-section view of the ESD network fabricated on a substrate is illustrated. A substrate 510 may be non-conductive or conductive. If conductive, an insulation layer 516 may be used, and if non-conductive then no insulation layer 516 may be required. A first coil turn 202a is formed over the insulation layer 516 or over the non-conductive substrate 510. The first coil turn 202a is connected to an external input node 206. An insulation layer 514a is formed over the first coil turn 202a. A second coil turn 202b is formed over the insulation layer 514a. Another insulation layer 514b is formed over the second coil turn 202b. A third coil turn 202c is formed over the insulation layer 514b. Still another insulation layer 514c is formed over the third coil turn 202c. Yet another insulation layer 514d is formed over the third coil turn 202c. A fourth coil turn 202d is formed over the insulation layer 514c. And another insulation layer 514d is formed over the fourth coil turn 202d. The fourth coil turn 202d is connected to an internal node 208. Any number of coil turns and insulation layers are contemplated and within the scope of the present invention.

ESD clamp devices 512a, 512b, 512c and 512d may comprise PMOS and NMOS transistors, and may be connected to power supply rails, $V_{DD}$ and $V_{SS}$, in a fashion similar to the PMOS and NMOS transistor connections illustrated in FIG. 1. It is also contemplated and within the scope of the invention that the ESD clamp devices may be any type of clamp device, connected to a substrate common or earth ground. The ESD clamp devices 512a, 512b, 512c and 512d may be connected to the coil turns 202a, 202b, 202c and 202d, respectively, through conductive vias (holes) in the insulation layers 514a, 514b, 514c and 514d. The vias are filled with a conductive material such as aluminum. As illustrated in FIG. 5, Vias 518a pass through insulation layers 514d, 514c and 514b, and connect the ESD clamp device 512a to the coil turn 202a. The vias 518a do not connect to the other coil turns 202b, 202c and 202d. Vias 518b pass through insulation layers 514d, 514c and 514b, and connect the ESD clamp device 512b to the coil turn 202b. The vias 518b do not connect to the other coil turns 202a, 202c and 202d. Vias 518c pass through insulation layers 514d and 514c, and connect the ESD clamp device 512c to the coil turn 202c. The vias 518c do not connect to the other coil turns 202a, 202b and 202d. Via 518d passes through insulation layer 514d, and connects the ESD clamp device 512d to the coil turn 202d. It is also contemplated and within the scope of the invention that the ESD clamp devices may be formed on each of the insulation layers and attached to the conductive layer coil turns on the insulation layers.

Figure 6:
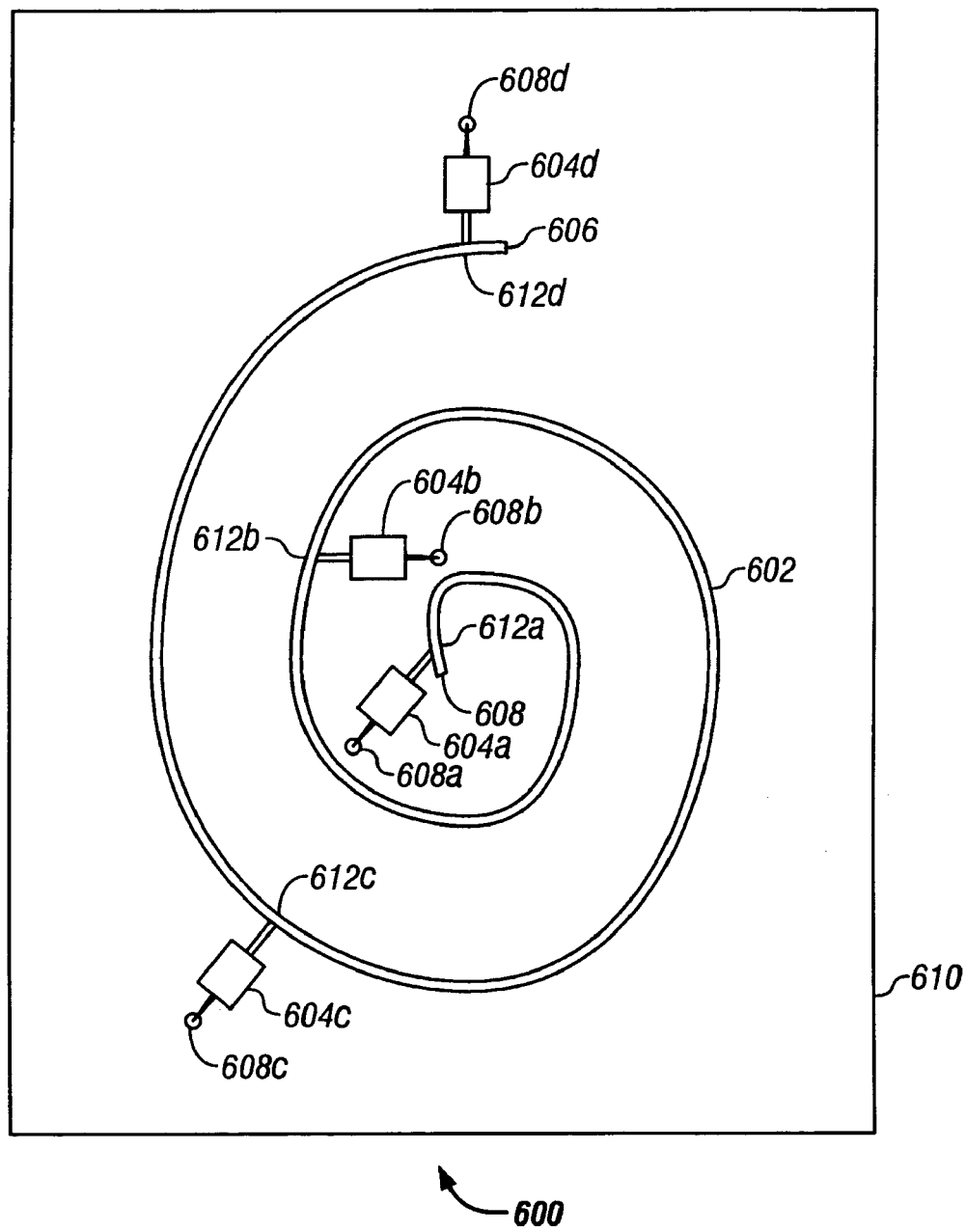
FIGS. 6 and 7 are a schematic plan view and an elevational view, respectively, of an ESD protection network fabricated on an non-conductive portion of the printed circuit board using printed circuit stripline conductors and surface mounted components.
Figure 7:
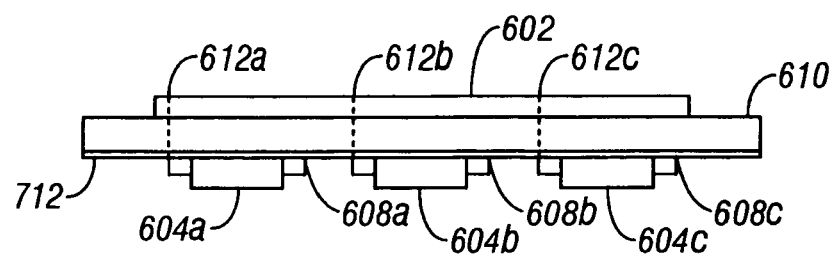

Referring now to FIGS. 6 and 7, a schematic plan view and an elevational view, respectively, of an ESD protection network fabricated on an non-conductive printed circuit board using printed circuit stripline conductors and surface mounted components is illustrated. It is contemplated and within the scope of the invention that transmission line strictures may be used instead of coil shaped structures with the ESD clamp devices. The non-conductive portion of a printed circuit board 610 may be, for example but not limitation, glass epoxy, TEFLON® (a registered trademark of Dupont Co.), ceramic, glass and the like. The printed circuit stripline enables a constant impedance for the signal path. A plurality of turns of a coil 602 are formed on the printed circuit board 610 in a concentric spiral configuration. Conductive vias 612a–612d (plated through holes) may be formed through the printed circuit board 610 at each of the plurality of coil turns, or portions thereof. ESD clamp devices 604a–604d may be attached to respective ones of these vias 612a–612d and to a planar ground plane 712. The ground plane 712 may be located on the face opposite the face on which the plurality of coil turns 602 is located thereon. The ESD clamp devices 604 may be connected to the coil turns 602 by vias 612, and to the planar ground plane 710 by vias 608, or, preferably, by using surface mount techniques. The plurality of coil turns 602 may be tapped with, for example, the vias 612 at points along the coil 602 which may represent a desired inductance needed to cancel out the parasitic capacitance of the associated ESD clamp devices 604. The ESD clamp devices 604 may connect to the outer or larger coil turn(s) at less than 360 degrees, and the ilner or smaller coil turns 602 at more than 360 degrees, i.e., a multiple turn.

Figure 8:
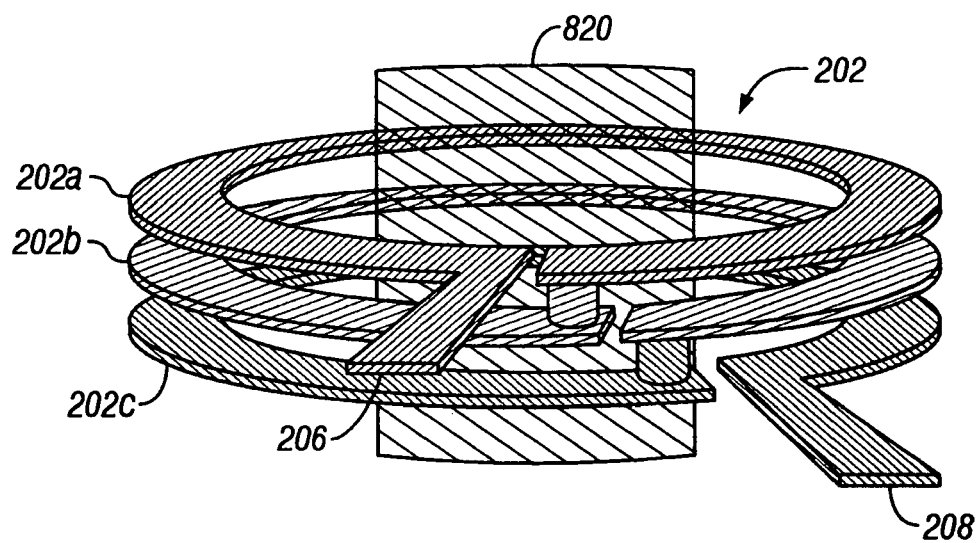
FIG. 8 is a schematic orthogonal view of the coil portion of FIG. 3 and a core having magnetic properties to increase the inductance of the coil.

According to the aforementioned embodiments of the present invention, the insulation layers between the coil turns of the inductor may preferably be very thin so that the turns of the coil are close together, thus, improving the magnetic coupling therebetween and increasing the effective inductance for a given size coil diameter. Referring to FIG. 8, a schematic orthogonal view of the coil portion of FIG. 3 and a core having magnetic properties to increase the inductance of the coil 202 is illustrated. A core 820 comprising a material of high magnetic permeability may be located within the coil 202 so as to further increase the effective inductance value for a give size of coil structure. This material may be, for example but not limitation, iron, iron oxide, ferrite ceramic, ferrous oxide, or other materials that increase the effective inductance of the inductor coil.

The present invention, therefore, is well adapted to carry out the objects and attain the ends and advantages mentioned, as well as others inherent therein. While the present invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electrostatic discharge (ESD) protection network, comprising:
   an inductor having a plurality of turns in the shape of a coil, the plurality of turns having an inductance; and
   a plurality of electrostatic discharge (ESD) clamp devices, each one of said plurality of ESD clamp devices having a parasitic capacitance, each one of said plurality of ESD clamp devices being connected to a corresponding one of said plurality of turns of said inductor, the inductance of said turns and the parasitic capacitance of said ESD clamp devices thereby forming a low pass filter.

2. The ESD protection network of claim 1, wherein said plurality of turns and said plurality of ESD clamp devices are fabricated on a surface selected from a group consisting of a substrate surface and an integrated circuit die surface.

3. The ESD protection network of claim 1, wherein said plurality of turns and said plurality of ESD clamp devices are fabricated on an integrated circuit die.

4. An integrated circuit apparatus having an electrostatic discharge (ESD) protection network, said apparatus comprising:
an integrated circuit substrate;
a first insulation layer over a face of said integrated circuit substrate;
a plurality of conductive layers, each of the plurality of conductive layers in the shape of a coil turn, the coil turn having a first end and a second end;
a plurality of insulation layers interleaved between the plurality of conductive layers;
a one of said plurality of conductive layers proximate to said first insulation layer and the other ones of said plurality of conductive layers stacked over the one with said plurality of insulation layers interleaved therebetween;
a plurality of conductive vias in the plurality of insulation layers, the plurality of conductive vias connecting adjacent ones of the coil turns of said plurality of conductive layers, thereby forming an inductor coil for generating an inductance for said low pass filter; and
a plurality of electrostatic discharge (ESD) clamp devices, each one of said plurality of ESD clamp devices having a parasitic capacitance, each one of said plurality of ESD clamp devices being connected to a corresponding one of the coil turns of said plurality of conductive layers, thereby forming a low pass filter.

5. The apparatus of claim 4, wherein respective ones of said plurality of conductive vias connect the second end of each one of the coil turns of said plurality of conductive layers to the first end of each of the adjacent ones of the coil turns of said plurality of conductive layers, thereby forming the inductor coil.

6. The apparatus of claim 5, wherein each of the respective ones of said plurality of conductive vias is at least one via.

7. The apparatus of claim 5, wherein each of the respective ones of said plurality of conductive vias is two or more vias so as to reduce electrical connection resistance thereof.

8. The apparatus of claim 4, wherein the shape of the coil turns of said plurality of conductive layers is selected from the group consisting of round, square, rectangle, triangle, oval, hexagon and octagon.

9. The apparatus of claim 4, wherein said plurality of conductive layers are made of metal.

10. The apparatus of claim 9, wherein the metal is selected from the group consisting of copper, aluminum, copper alloy and aluminum alloy.

11. The apparatus of claim 4, wherein said plurality of conductive layers are made of conductive doped polysilicon.

12. The apparatus of claim 4, further comprising a magnetic material interposed concentrically inside of an inner diameter of the coil turns of said plurality of conductive layers so as to increase the inductance thereof.

13. The apparatus of claim 12, wherein the magnetic material is selected from the group consisting of iron, iron oxide, ferrite ceramic and ferrous oxide.

14. The apparatus of claim 4, wherein at least one ESD clamp device is connected to each one of said plurality of conductive layers.

15. The apparatus of claim 4, wherein at least one of said plurality of conductive layers is connected to one of said plurality of ESD clamp devices.

16. The apparatus of claim 4, wherein said plurality of ESD clamp devices are fabricated in said integrated circuit substrate and connected to said plurality of conductive layers with vias through said plurality of insulation layers.

17. The apparatus of claim 4, wherein said plurality of ESD clamp devices are fabricated on at least one of said plurality of insulation layers and connected to said plurality of conductive layers with vias through said plurality of insulation layers.

18. A method for providing an electrostatic discharge (ESD) protection network, comprising:
forming a plurality of conductive layers and a plurality of insulation layers, wherein said plurality of conductive layers and said plurality of insulation layers are interleaved, wherein each of the conductive layers is formed in the shape of a coil turn having an inductance such that each of the coil turns has a first and a second end;
forming a plurality of vias in said plurality of insulation layers, the plurality of vias being located between the ends of adjacent coil turns wherein conductive material is formed in said plurality of vias thereby connecting the first end of one coil turn to the second end of the adjacent coil turn for generating an inductance for said low pass filter;
providing a plurality of electrostatic discharge (ESD) clamp devices, each one of said plurality of ESD clamp devices having a parasitic capacitance; and
connecting each one of said plurality of ESD clamp devices to a corresponding one of the coil turns of said plurality of conductive layers, thereby forming a low pass filter.

19. The method of claim 18, wherein connecting said plurality of ESD clamp devices comprises connecting at least one ESD clamp device to each one of said plurality of conductive layers.

20. The method of claim 18, wherein connecting said plurality of ESD clamp devices comprises connecting at least one of said plurality of conductive layers is to one of said plurality of ESD clamp devices.

21. A device comprising a protection circuit, said protection circuit comprising:
an inductor having a plurality of turns in the shape of a coil, the plurality of turns having an inductance;
a plurality of electrostatic discharge (ESD) clamp devices, each one of said plurality of ESD clamp devices having a parasitic capacitance, each one of said plurality of ESD clamp devices being connected to a corresponding one of said plurality of turns of said inductor, the inductance of said turns and the parasitic capacitance of said ESD clamp devices thereby forming a low pass filter and;
at least one via for forming an inductor coil for generating an inductance for said low pass filter.

22. The device of claim 21, wherein said device is a semiconductor device.

23. The device of claim 21, wherein said plurality of turns and said plurality of ESD clamp devices are fabricated on a surface selected from the group consisting of a substrate surface and an integrated circuit die surface.

24. The device of claim 21, wherein said plurality of turns and said plurality of ESD clamp devices are fabricated on an integrated circuit die.

* * * * *